United States Patent [19]
Shahriari et al.

[11] Patent Number: 5,795,172
[45] Date of Patent: Aug. 18, 1998

[54] PRODUCTION PRINTED CIRCUIT BOARD (PCB) EDGE CONNECTOR TEST CONNECTOR

[75] Inventors: Navid Shahriari, Chandler, Ariz.; Mike Mayberry, Beaverton, Oreg.; Nasser Barabi, Hayward, Calif.

[73] Assignee: Intel Corporation, Santa Clara, Calif.

[21] Appl. No.: 768,961

[22] Filed: Dec. 18, 1996

[51] Int. Cl.[6] ................................................ H01R 13/15
[52] U.S. Cl. ............................................................ 439/260
[58] Field of Search ............................ 439/260, 62, 493, 439/492, 259, 261, 267, 329, 630, 632, 59, 67

*Primary Examiner*—Gary F. Paumen
*Assistant Examiner*—Yong Ki Kim
*Attorney, Agent, or Firm*—Blakely, Sokoloff, Taylor & Zafman

[57] ABSTRACT

A zero insertion force card edge connector for a printed circuit board assembly tester. The test connector includes a plurality of electrical contacts located within a slot of a housing. The contacts are connected to a test motherboard by a flexible circuit board. Also located within the slot is a plate which can be moved between an open position and a closed position by an actuator. When the plate is in the open position a printed circuit board assembly can be inserted into the test connector without having to overcome any spring forces of the connector. The circuit board assembly is inserted into the slot so that the contacts are aligned with surface pads located along an edge of the circuit board. The actuator is then actuated to move the plate into the closed position and push the contacts into the surface pads. The surface pads of the board are electrically connected to the test motherboard through the contacts and flexible circuit board. After the circuit board assembly is tested the actuator is again actuated to move the plate back to the open position to disengage the contacts from the surface pads. The circuit board assembly can then be removed from the slot so that another assembly can be tested.

13 Claims, 3 Drawing Sheets

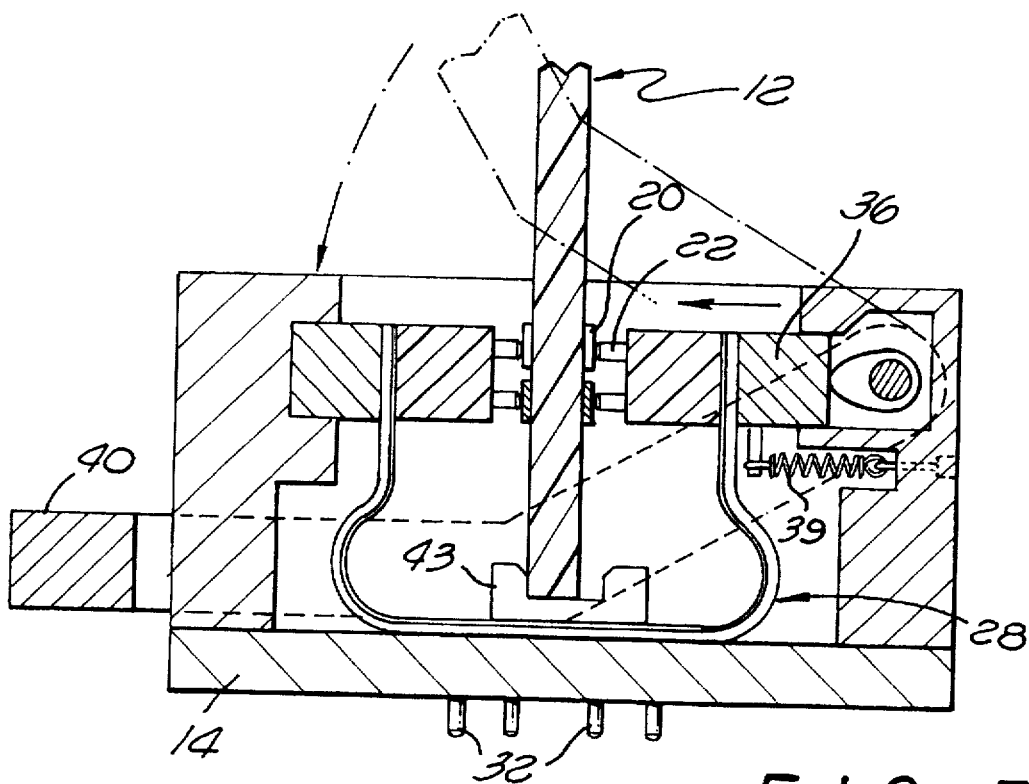
FIG. 3
FIG. 4
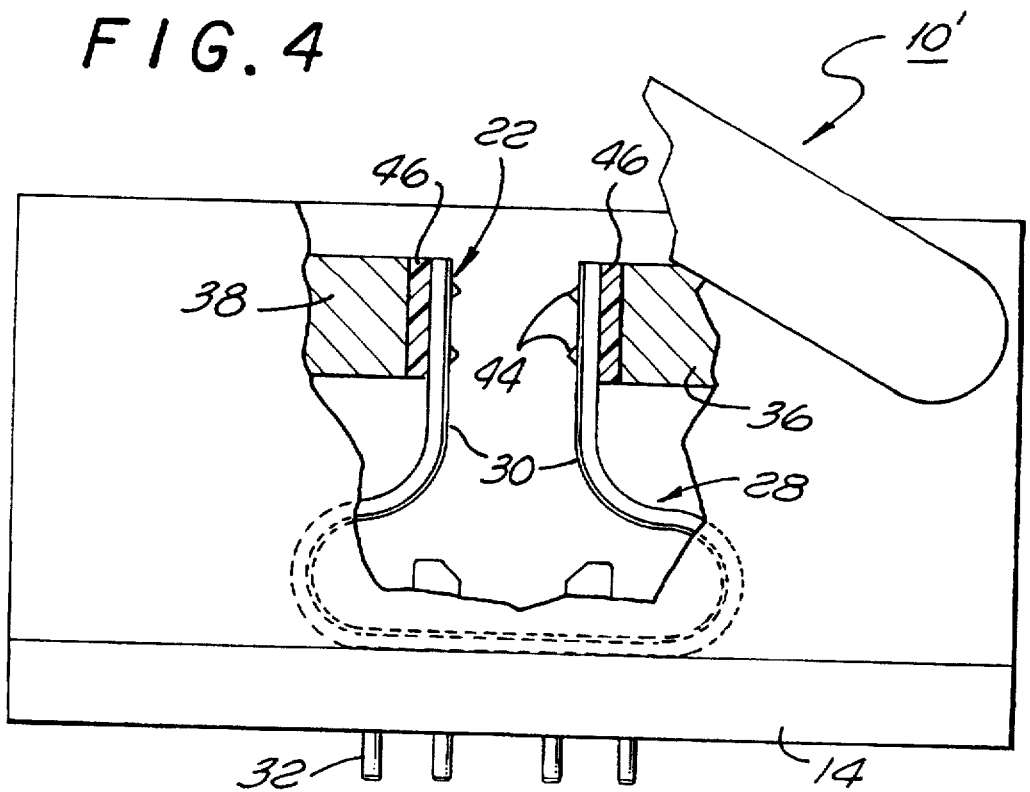

5,795,172

1

PRODUCTION PRINTED CIRCUIT BOARD (PCB) EDGE CONNECTOR TEST CONNECTOR

BACKGROUND OF THE INVENTION

1. Field of the Invention

The present invention relates to a test connector that couples a printed circuit board assembly to a test board.

2. Description of Related Art

Integrated circuits are housed within packages that are solder to printed circuit boards. Some printed circuit boards have a number of surface pads located along an edge of the board. The surface pads are connected to the integrated circuit packages by routing layers of the printed circuit board. The edge of the board and surface pads are plugged into a corresponding connector within a computer assembly. The integrated circuits are coupled to a motherboard of the assembly through the routing layers, surface pads and connector. The connectors are commonly referred to as card edge connectors.

In a manufacturing environment the printed circuit board assemblies are typically tested by a tester after the integrated circuit packages have been soldered to the board. The tester has a card edge connector that is mounted to a test motherboard. A circuit board assembly is tested by manually pushing the board into the card edge connector.

Card edge connectors typically have a plurality of spring like contacts which are pressed into the surface pads. To plug in a board, the operator must exert enough force to overcome the spring force of the contacts. A production facility may produce thousands or millions of circuit board assemblies which must be plugged into a test connector. The repetitiveness of inserting so many circuit boards into the test connector may cause fatigue and injury to the operator. It would be desirable to provide a test connector for a card edge circuit board assembly which requires zero insertion force to plug the assembly into the connector.

SUMMARY OF THE INVENTION

The present invention is a zero insertion force card edge connector for a printed circuit board assembly tester. The test connector includes a plurality of electrical contacts located within a slot of a housing. The contacts are connected to a test motherboard by a flexible circuit board. Also located within the slot is a plate which can be moved between an open position and a closed position by an actuator. When the plate is in the open position a printed circuit board assembly can be inserted into the test connector without having to overcome any spring forces of the connector. The circuit board assembly is inserted into the slot so that the contacts are aligned with surface pads located along an edge of the circuit board. The actuator is then actuated to move the plate into the closed position and push the contacts into the surface pads. The surface pads of the board are electrically connected to the test motherboard through the contacts and flexible circuit board. After the circuit board assembly is tested the actuator is again actuated to move the plate back to the open position to disengage the contacts from the surface pads. The circuit board assembly can then be removed from the slot so that another assembly can be tested.

2

FIG. 3 is a side sectional view showing a printed circuit board assembly inserted into the test connector;

FIG. 4 is a side sectional view of an alternate embodiment of the test connector.

DETAILED DESCRIPTION OF THE INVENTION

Figure 1:
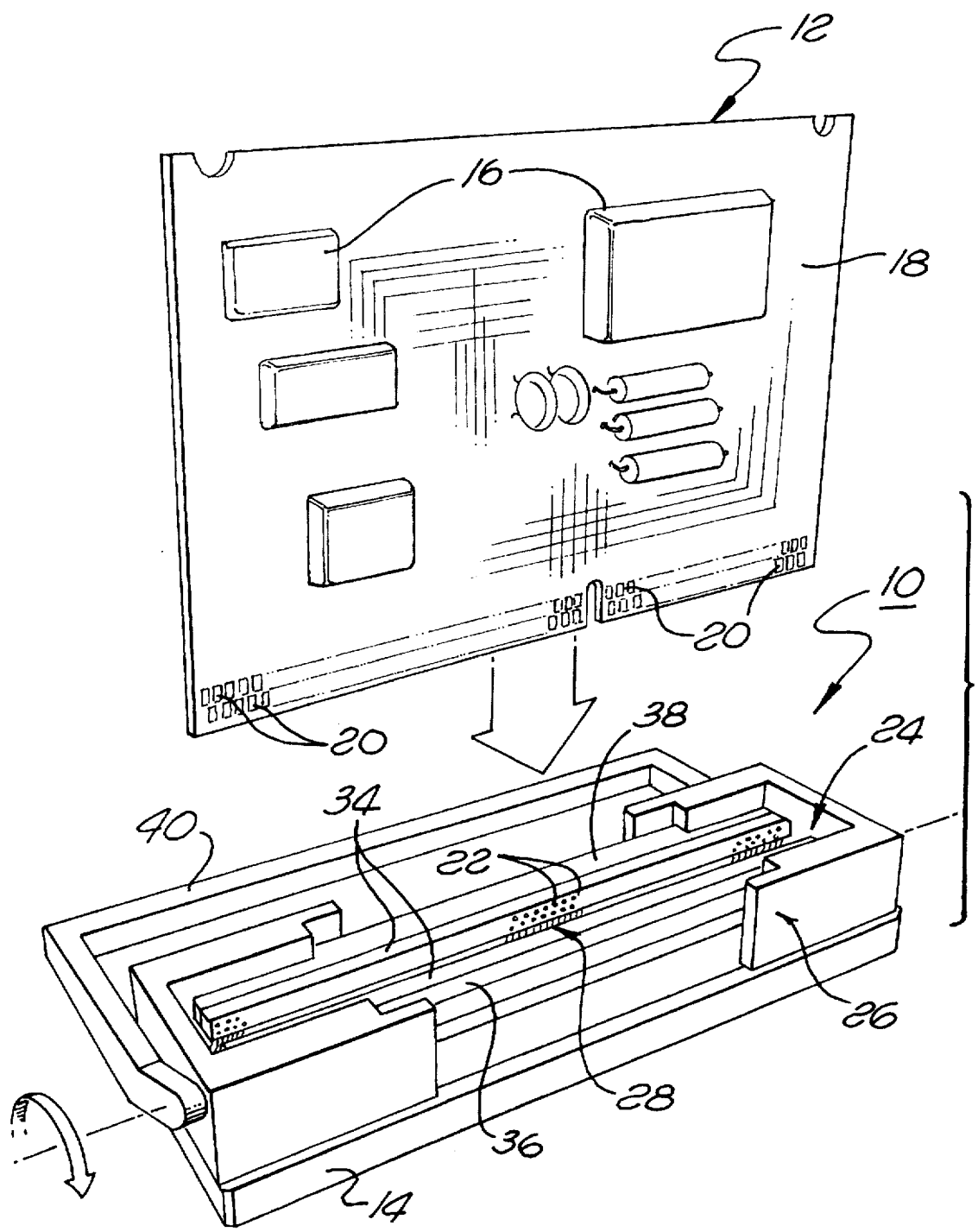
FIG. 1 is a perspective view of a test connector of the present invention.
Figure 2:
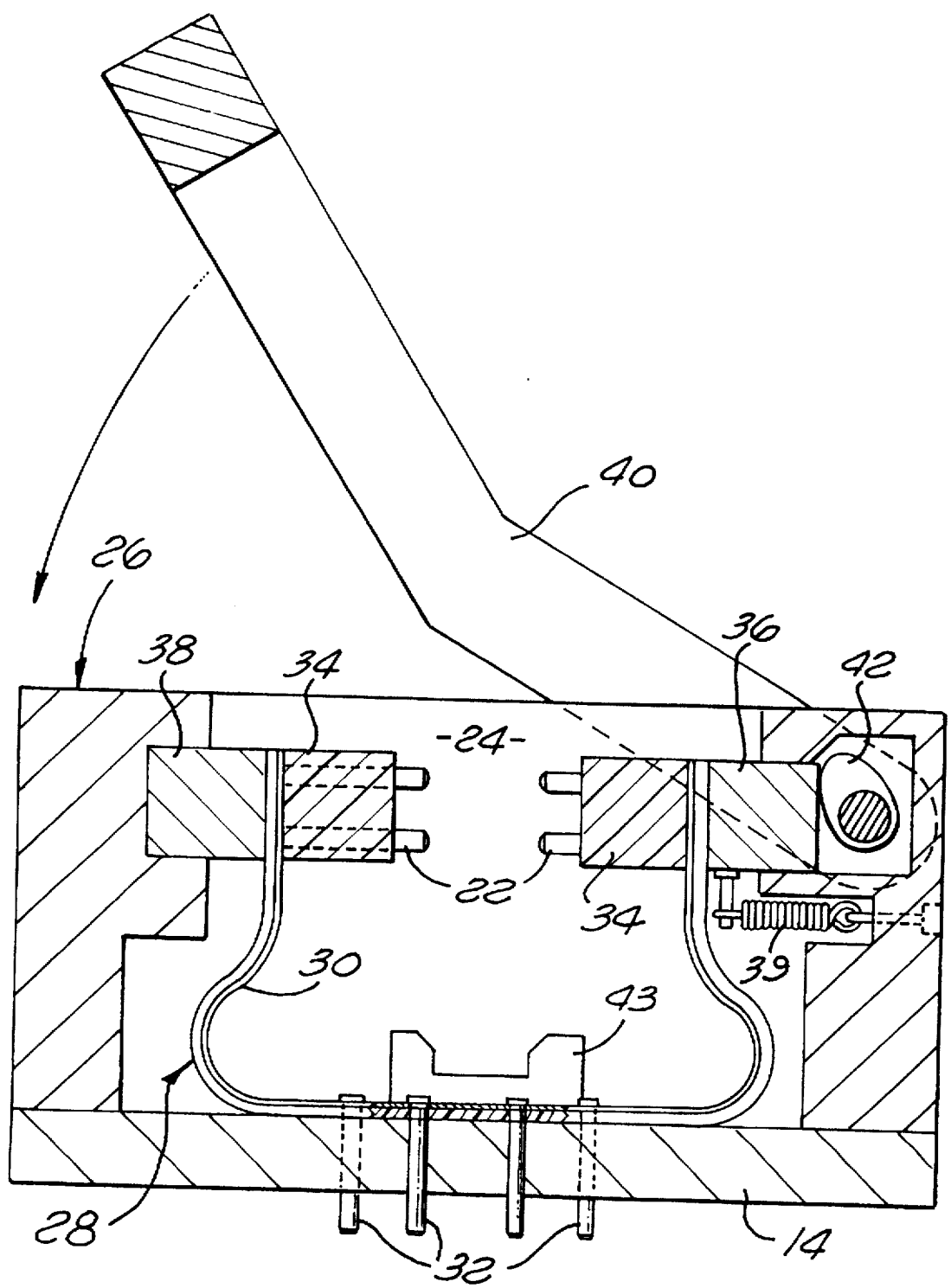
FIG. 2 is a side sectional view of the test connector.

Referring to the drawings more particularly by reference numbers, FIGS. 1 and 2 show a test connector 10 of the present invention. The test connector 10 is used to couple a printed circuit board assembly 12 to a test motherboard 14. The printed circuit board assembly 12 includes a plurality of integrated circuit packages 16 mounted to a printed circuit board 18. The printed circuit board 18 has a plurality of surface pads 20 located along an edge of the board 18. The surface pads 20 are connected to the integrated circuit packages 16 by routing layers of the circuit board 18. The surface pads 20 are typically located on both sides of the circuit board 18. The test motherboard 14 is typically coupled to an electrical tester (not shown) which can test the printed circuit board assembly 12.

The test connector 10 includes a plurality of electrical contacts 22 located within a slot 24 of a housing 26. The housing 26 is mounted to the test motherboard 14. The electrical contacts 22 may be pins that are soldered to a flexible printed circuit board 28. The flex circuit 28 contains internal routing traces 30 that are soldered to pins 32 that extend from the test motherboard 14. The traces 30 couple the electrical contacts 22 to the motherboard 14.

The electrical contacts 22 may be attached to a pair of molded dielectric inserts 34 located on opposing sides of the slot 24. The inserts 34 are attached to a pair of plates 36 and 38. One of the plates 36 can move relative to the housing 26 between an open position and a closed position. The plate 36 and corresponding electrical contacts 22 are biased into the open position by a spring 38. Although one moving plate 34 is shown and described, it is to be understood that the connector 10 may have two moving plates 36 and 38. Additionally, although contacts 22 are shown on both sides of the slot 24, it is to be understood that for a single sided printed circuit board 18, the connector 10 may have electrical contacts 22 on the stationary plate 38, or the moving plate 36.

The test connector 10 further includes a handle 40 that is pivotally connected to the housing 26. The handle 40 is also connected to a cam 42 which rotates to move the plate 36 between the open and closed positions. The handle 40, cam 42 and springs 38 provide an actuator which can be actuated by an operator to move the plate 36 and corresponding contacts 22 between the open and closed positions by rotating the handle 40. Although a manually operated cam-lever actuator is shown and described, the test connector 10 may employ other types of actuators to move the plate 36 between the open and closed positions. For example, the connector 10 may have a pneumatic piston which is actuated by a. button to move the plate 36.

In operation, the handle 40 is rotated so that the plate 36 is in the open position. The printed circuit board 18 is inserted into the slot 24 so that the surface pads 20 are aligned with the electrical contacts 22. The housing 26 may have a block 43 that supports and aligns the board 18 within the slot 24. In the open position the electrical contacts 22 do not impede the insertion of the printed circuit board 18 so that the connector 10 requires essentially zero insertion force.

As shown in FIG. 3, the handle 40 is then rotated to move the plate 36 into the closed position. Movement of the plate 36 pushes the electrical contacts 22 into the surface pads 22 of the printed circuit board 18 to electrically couple the integrated circuit packages 16 with the test motherboard 14. The printed circuit board assembly 12 can then be tested within the connector 10. After testing, the handle 40 is rotated to move the plate 36 back to the open position and disengage the electrical contacts 22 from the surface pads 22. The printed circuit board 18 can be removed from the slot 24 and replaced with another part 12.

FIG. 4 shows an alternate embodiment of a connector 10', wherein the electrical contacts 22 are gold dots 44 that extend from the traces 30 of the flexible circuit board 28. The gold dots 42 are pressed into the surface pads 22 by the plate 36 in the same manner as the connector 10 shown in FIGS. 1–3. The connector 10' preferably contains elastomeric strips 46 located between the flex circuit 28 and the plates 36 and 38, to insure contact between all of the dots 44 and the surface pads 22.

What is provided is a relatively inexpensive test connector that requires essentially zero insertion force. The test connector 10 is particularly useful in a production facility where a large number of printed circuit boards 18 are inserted into the connector 10.

What is claimed is:

1. A test connector for coupling a printed circuit board which has a plurality of surface pads, to a tester, comprising:

a housing which has a slot that receives the printed circuit board;

a plate that moves relative to said housing between an open position and a closed position;

a plurality of contacts that are located within said slot and coupled to said plate; and, an actuator that is actuated to move said plate into the closed position to push said contacts into the contact pads of the printed circuit board, and wherein said actuator includes a spring that biases said plate into the open position.

2. The test connector as recited in claim 1, wherein said contacts are also coupled to said housing.

3. The test connector as recited in claim 1, further comprising a flexible printed circuit board that is connected to said contacts and a motherboard.

4. The test connector as recited in claim 1, wherein said contacts each include a pin.

5. The test connector as recited in claim 1, wherein said contacts each include a gold dot.

6. The test connector as recited in claim 1, wherein said contacts are pressed into the surface pads in a direction that is essentially perpendicular to the printed circuit board.

7. The test connector as recited in claim 1, wherein said actuator includes a handle that can be rotated by an operator to move said plate between the open and closed positions.

8. A test connector for coupling a printed circuit board which has a plurality of surface pads, to a tester, comprising:

a housing which has a slot that receives the printed circuit board;

a plate that moves relative to said housing between an open position and a closed position;

a plurality of contacts that are located within said slot and coupled to said housing; and, an actuator that is actuated to move said plate into the closed position to push the surface pads of the printed circuit board into said contacts, and wherein said actuator includes a spring that biases said plate into the open position.

9. The test connector as recited in claim 8, further comprising a flexible printed circuit board that is connected to said contacts and a motherboard.

10. The test connector as recited in claim 8, wherein said contacts each include a pin.

11. The test connector as recited in claim 8, wherein said contacts each include a gold dot.

12. The test connector as recited in claim 8, wherein said contacts are pressed into the surface pads in a direction that is essentially perpendicular to the printed circuit board.

13. The test connector as recited in claim 8, wherein said actuator includes a handle that can be rotated by an operator to move said plate between the open and closed positions.

\* \* \* \* \*